(12) United States Patent
Copner

(10) Patent No.: US 10,230,071 B2
(45) Date of Patent: Mar. 12, 2019

(54) ORGANIC LIGHT EMITTING DIODE STRUCTURE AND METHOD OF FORMING SAME

(71) Applicant: Lomox Limited, Cheshire (GB)

(72) Inventor: Nigel Joseph Copner, Gwent (GB)

(73) Assignee: LOMOX LIMITED, Cheshire (GB)

( * ) Notice: Subject to any disclaimer, the term of this patent is extended or adjusted under 35 U.S.C. 154(b) by 0 days.

(21) Appl. No.: 15/499,251

(22) Filed: Apr. 27, 2017

(65) Prior Publication Data

US 2017/0338445 A1 Nov. 23, 2017

Related U.S. Application Data

(62) Division of application No. 14/894,674, filed as application No. PCT/GB2014/051619 on May 28, 2014, now Pat. No. 9,705,109.

(30) Foreign Application Priority Data

May 29, 2013 (GB) .................................. 1309602.9

(51) Int. Cl.
*H01L 51/52* (2006.01)
*G02B 5/18* (2006.01)
*H01L 51/50* (2006.01)
*H01L 51/56* (2006.01)

(52) U.S. Cl.
CPC ........ *H01L 51/5275* (2013.01); *G02B 5/1857* (2013.01); *H01L 51/5012* (2013.01); *H01L 51/56* (2013.01); *H01L 2251/558* (2013.01)

(58) Field of Classification Search
CPC . H01L 51/5275; H01L 51/5012; H01L 51/56; H01L 27/32; H01L 2251/558; G02B 5/1857
See application file for complete search history.

(56) References Cited

U.S. PATENT DOCUMENTS

2013/0228759 A1* 9/2013 Koch .................. H01L 51/5262 257/40

FOREIGN PATENT DOCUMENTS

JP 2001-0250692 * 9/2001

* cited by examiner

*Primary Examiner* — Armando Rodriguez
(74) *Attorney, Agent, or Firm* — Hartman Global IP Law; Gary M. Hartman; Domenica N. S. Hartman

(57) ABSTRACT

There is provided organic light emitting diode (OLED) device that include an organic electroluminescent layer formed between a first electrode and a second electrode. The organic electroluminescent layer is formed of a photo-crosslinkable liquid having dichroic molecules therein, and has a grating pattern defined therein by exposure of regions of the organic electroluminescent layer to a light beam. The refractive index of the exposed regions of the organic electroluminescent layer varies across the grating pattern. A method for fabricating the OLED device is also provided that includes providing the organic electroluminescent layer and defining the grating pattern in the photo-crosslinkable liquid by illuminating regions of the organic electroluminescent layer with a light beam. The refractive index of the defined grating pattern is tuned by adjusting the dosage of light to which the photo-crosslinkable liquid is exposed.

15 Claims, 4 Drawing Sheets

Grating Period $p=\lambda/(2\sin\theta)$

Grating Period $p=\lambda/(2\sin\theta)$

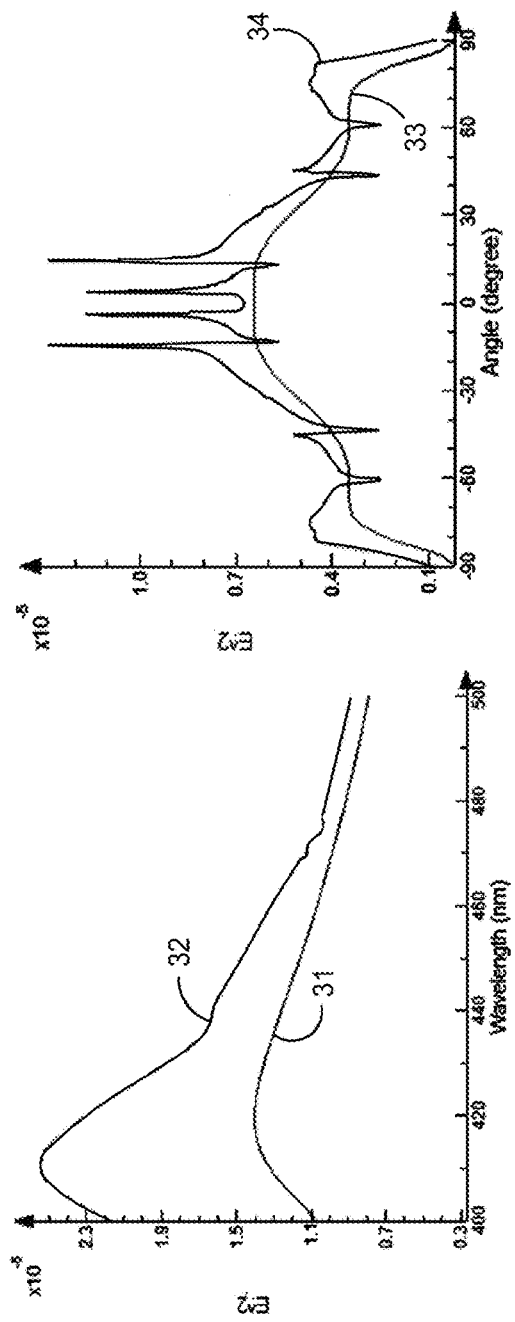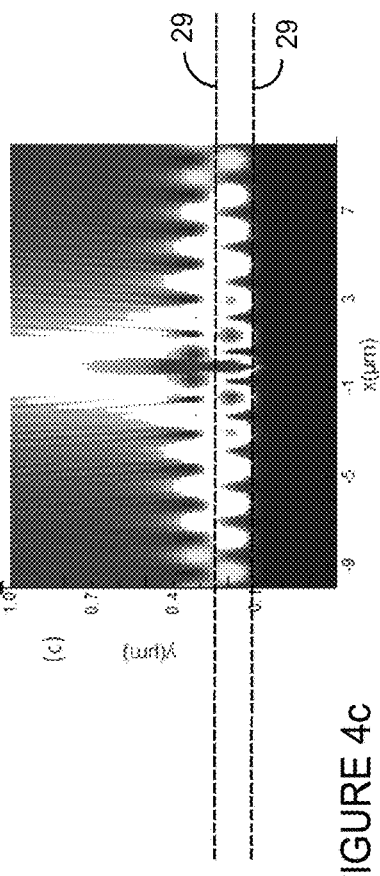
FIGURE 4a
FIGURE 4b
FIGURE 4c

ORGANIC LIGHT EMITTING DIODE STRUCTURE AND METHOD OF FORMING SAME

This is a division patent application of co-pending U.S. patent application Ser. No. 14/894,674, filed Nov. 30, 2015, which is a national stage patent application of prior co-pending international application Serial No. PCT/GB14/051619 filed May 28, 2014. The contents of these prior applications are incorporated herein by reference.

This invention relates to electroluminescent devices and in particular to electroluminescent devices based on organic light emitting diodes (OLEDs).

Known organic light-emitting diodes (OLEDs) generally comprise an emissive electroluminescent organic semiconductor material layer formed between a cathode and an anode, whereby the electroluminescent organic semiconductor material emits light when a voltage is applied across the anode and cathode electrodes.

In order for visible light to be emitted from the OLED, at least one of the electrodes must be transparent to radiation in the 350 nm-800 nm wavelength range.

OLEDs are considered to be suitable candidates for the next generation of displays e.g. flat panel displays because of their advantages over conventional technologies used in traditional displays e.g. liquid Crystal displays (LCDs) and plasma display panels (PDPs). OLEDs are also being increasingly used in lighting applications, replacing the more common incandescent bulbs.

Such advantages over LCDs and PDPs include, lower fabrication costs, light-weight, flexible plastic substrates, wider viewing angles & improved brightness, increased power efficiency and faster response time. However, whilst efficient in comparison to LCDs and PDPs, the efficiency of the OLED is limited, due to incomplete light extraction from the active, light-emitting layer due to losses in the OLED.

FIG. 1 shows in section, a conventional OLED 1 of the prior art, whereby an organic electroluminescent material layer 2 is located between two electrodes; a transparent anode 4 and a reflecting cathode 6.

The specific type of electroluminescent layer to be used may vary depending on the application of the OLED. For example, such material for the electroluminescent material may include organometallic chelates, for example $Alq_3$, fluorescent and phosphorescent dyes and conjugated dendrimers. Alternatively, organic polymer molecules may be used, whereby typical polymers include derivatives of poly (p-phenylene vinylene) and polyfluorene. Substitution of side chains onto the polymer may determine the colour of emitted light or the stability and solubility of the polymer for performance and ease of processing. Furthermore, a polymer such as poly(n-vinylcarbazole) may be used as a host material to which an organometallic complex is added as a dopant. Iridium complexes such as $Ir(mppy)_3$ or complexes based on other heavy metals such as platinum may also be used.

The anode 4 is fabricated from a transparent material (e.g. indium-tin-oxide (ITO)), whilst the cathode 6 may be fabricated from a reflective metal (e.g. magnesium-silver or lithium-aluminium alloy). A protective substrate (not shown) is then deposited over the anode 4. The substrate may be flexible. Alternatively, the anode, cathode and electroluminescent material may be deposited on the substrate.

In operation, when a voltage 10 is applied across the electrodes 4 and 6, holes from the anode 4 and electrons from the cathode 6 are injected into the organic layer 2. These holes and electrons migrate through the organic layer 2 until they meet and recombine to form an exciton. Relaxation from the excited to ground states then occurs, causing emission of light 12 through the transparent anode 4.

Furthermore, it is known to use different layers and materials to increase the efficiency of OLEDs, whereby hole and electron injection and/or blocking and/or transport layers are used to optimise the electric properties of the OLED. For example, hole injection (HIL) e.g. Cu/Pc and/or hole transport layers (HTL) e.g. aNPD, Triarylamines, and/or electron transport (ETL) e.g. Alq3 and/or Hole Blocking layers (HBL) e.g. BCP may be used to improve electrical efficiency as required. When a voltage 10 is applied between the anode and the cathode in the OLED having the above-described structure, holes generated in the anode move to the emission layer through the HIL and the HTL, and electrons generated in the cathode move to the emission layer through the HBL and the ETL. The holes and electrons moved to the emission layer are recombined in the emitting layer to emit the light. The light generated in the emission layer is emitted to the outside through the anode. Whilst the HIL, HTL, ETL, and HBL address the electrical efficiency of OLEDs, one of the key challenges in the design of OLEDs is to optimize their light extraction efficiency.

For conventional OLEDs as depicted in FIG. 1, light extraction inefficiencies exist because light generated within a high-index organic material has difficulty propagating into the surrounding lower-index Anode/Glass substrate owing to total internal refection (TIR) at the glass/air interface, coupling to dielectric waveguide modes of the organic layers, in-plane emission, and dissipation into the metal contacts of the OLED. Approximately, 30% of the generated photons remain trapped in the glass substrate and 50% in the organic layers. Therefore, output coupling efficiency of known OLEDs is approximately only 20%.

Various approaches for improving the optical out coupling efficiency of OLEDs have been put forward. For example, the planar substrate/air interface may be modified in order to reduce repeated TIR e.g. by using a micro lens array, or a large half sphere lens on the substrate surface.

Other methods of improving out-coupling efficiency attempt to extract the light trapped in the organic/ITO layers for example by using a low refractive index porous aerogel, micro-cavity effects, or an embedded low-index grid photonic crystal pattern on the glass substrate. However, using these methods, the improvement in relation to OLED efficiency is limited. Moreover, some of these methods have disadvantages associated with them such as a reduction in electrical efficiency, a decrease in lifetime, a viewing angle dependent colour, complicated fabrication processes and high costs. For instance, eliminating TIR using antireflective coatings does not work as each of the layers will refract the light and ultimately the final interface with air will still meet the TIR condition. In addition, establishing gratings at pitches less than half the UV exposure wavelength is very difficult.

Accordingly, it is an object of the present invention to provide an improved OLED structure and method of fabricating thereof, which address the above-identified problems with conventional OLEDs.

In a first aspect there is provided an organic light emitting diode (OLED) comprising: an organic electroluminescent layer formed between a first electrode and a second electrode, characterised in that organic electroluminescent layer comprises a nano-structured grating pattern provided therein, wherein the grating is configured to modify the refractive index of the electroluminescent layer.

Preferably, the organic electroluminescent layer comprises a photo-crosslinkable liquid having dichroic molecules therein.

Preferably, the photo-crosslinkable liquid is sensitive to UV-laser radiation, wherein the refractive index of the electroluminescent layer is dependent on an intensity of the UV-laser radiation.

Preferably, the grating pattern is configured to provide a periodic refractive index change.

Preferably, wherein the grating pattern has a rectangular profile.

Preferably, the organic electroluminescent layer comprises a Fresnel lens structure profile.

Preferably, the OLED further comprises one of an HIL, HTL, ETL and/or HBL.

In a second aspect there is provided a method of fabricating a nano-structured grating pattern in a photo-sensitive organic electroluminescent layer of an OLED, the method comprising the steps of: illuminating the organic electroluminescent layer with first and second light beams having an angle θ therebetween, wherein the first and second light beams are configured to create an interference fringe in the organic electroluminescent layer.

Preferably, the photo-sensitive organic electroluminescent layer is sensitive to radiation having a wavelength between 10 nm and 400 nm.

Preferably, the first and/or second light beams have a wavelength between 10 nm and 400 nm.

Preferably, the first and second light beams are provided by a Mach-Zehnder interferometer.

In a third aspect there is provided an OLED comprising a nano-structured grating pattern in a photo-sensitive organic electroluminescent layer.

FIG. 4a shows a graphical representation of the calculated emission properties (output average electric field ($E^2$) versus wavelength (nm)) of the grating-assisted OLED of FIG. 2 in comparison to the OLED of FIG. 1;

FIG. 4b shows a graphical representation of the calculated emission properties (calculated output average electric filed ($E^2$) versus emission angle (degrees)) of the OLED of FIG. 1 in comparison to the grating-assisted OLED of FIG. 2;

FIG. 4c shows a graphical representation of the electric field distributions for the grating-assisted OLED of FIG. 2 at a wavelength of 410 nm;

FIG. 5a shows a graphical representation of the calculated emission properties (output average electric field ($E^2$) versus wavelength (nm)) of the grating-assisted OLED of FIG. 2 having a refractive index of 2.0 in comparison to the OLED of FIG. 1;

FIG. 5b shows a graphical representation of the calculated emission properties (output average electric field ($E^2$) versus wavelength (nm)) of the grating-assisted OLED of FIG. 2 having a refractive index of 2.1 in comparison to the OLED of FIG. 1;

FIG. 6a shows in section, a grating-assisted OLED according to a second embodiment of the present invention;

FIG. 6b is a representation of a Finite-difference time-domain (FDTD)-simulated Fresnel lens structure in the OLED of FIG. 6a; and FIG. 7 shows a graphical representation of the calculated emission properties (calculated output average electric field ($E^2$) versus emission angle (degrees)) of the OLED of FIG. 1 in comparison to the grating-assisted OLED of FIG. 6a.

Figure 1:
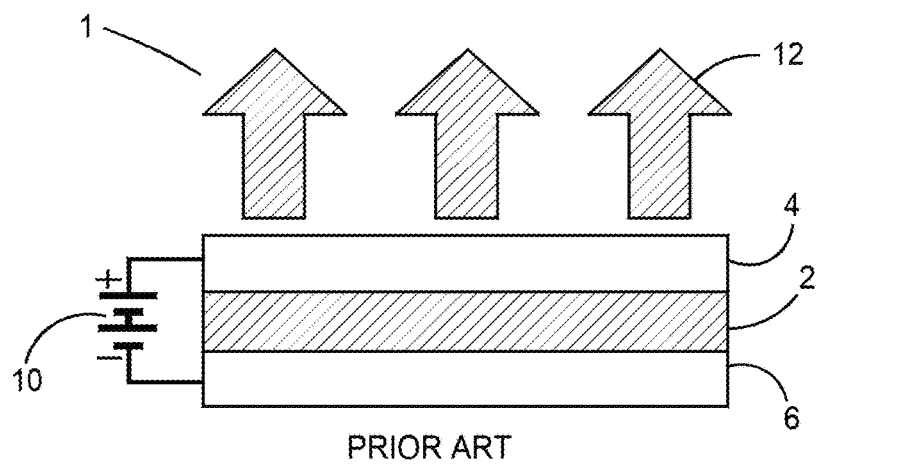
FIG. 1 shows in section, a conventional OLED of the prior art.
Figure 2:
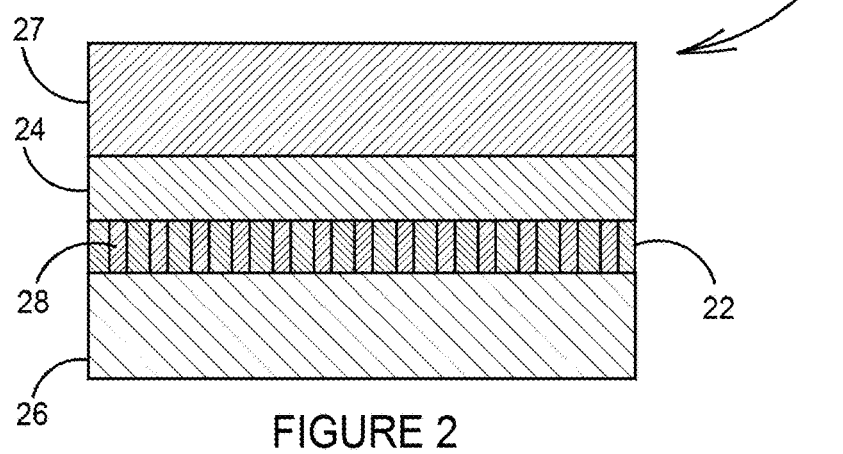
FIG. 2 shows in section, a grating-assisted OLED according to a first embodiment of the present invention.

FIG. 2 shows in section, an OLED 20 according to a first embodiment of the present invention, whereby an organic electroluminescent material layer 22 having a depth of 110 nm is located between two electrodes; an ITO anode 24 of 120 nm depth, and a reflecting cathode 26 of 100 nm depth, whilst a layer of protective glass 27 is provided atop the anode 24. As detailed above HIL, HTL, ETL and HBL could also be used in the OLED 20 to improve electrical efficiency as required.

The organic layer 22 is formed of a formed of a photo-crosslinkable liquid crystal with rod-shaped dichroic molecules. An optical grating 28 having a defined period P, is subsequently defined in the organic layer 22, whereby the grating 28 provides the organic layer 22 with a periodic refractive index change. The grating 28 is formed in the organic layer 22 using a Mach-Zehnder interferometer as described below in FIG. 3.

Initially, the anode 24 is deposited on a glass backplane 27. The organic layer 22 is then deposited on the anode 24 e.g using an inkjet printing process, spin coating, evaporation etc. The cathode 26 is then deposited using a suitable technique. Various layers e.g. HIL. HTL, HBL and/or ETL can also be deposited as required.

When a voltage (not shown) is applied across the electrodes 24, 26, electromagnetic radiation in the form of an electromagnetic light wave is generated in the organic layer 22. The grating assisted organic layer 22 provides enhanced light extraction in comparison to a conventional OLED, as shown in detail in FIGS. 4 and 4b below.

Figure 3:
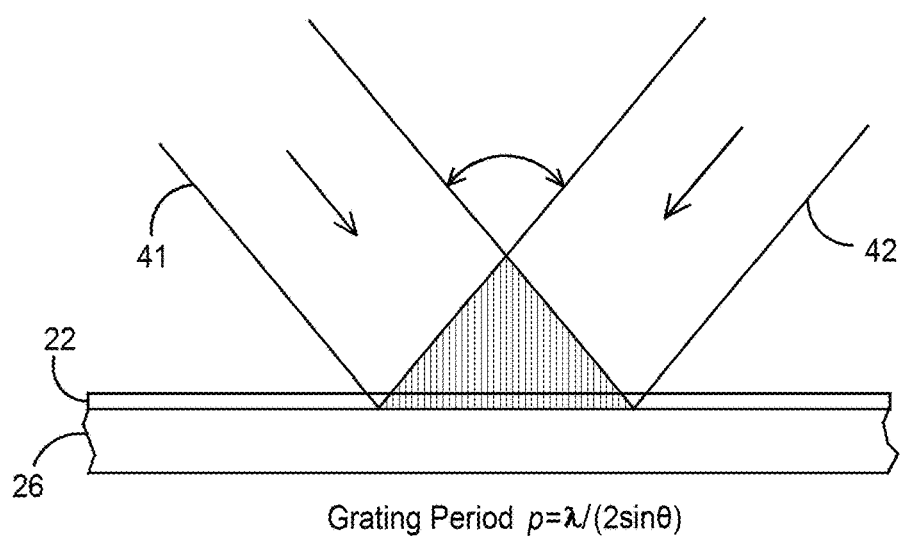
FIG. 3 shows in side-view, a system for forming a grating in an organic layer of the OLED of FIG. 2.

FIG. 3 shows a suitable method for forming a grating in the organic layer 22. Once the organic layer is deposited on the anode 24, a Mach-Zehnder interferometer is used to combine two split beams 41 & 42 such that the beams converge on the surface of the organic layer 22.

Illuminating the UV-sensitive organic layer 22 with an intensity-dependent-interference fringe using a Mach-Zehnder interferometer incorporating e.g. a UV laser source, provides the grating 28 in the organic layer 22, whereby the photosensitive organic material subjected to the UV light cross-links. The cross-linked material provides the grating 28 in the organic layer. An anode (not shown in FIG. 3) may be deposited on the surface of the OLED 20.

Alternatively, the grating may be formed in a UV photo-sensitive resist provided atop the organic layer e.g. evaporation, spin coating. Depending on whether the resist is positive or negative, the resist and organic material may then be etched away to provide an air/material grating 28 in the organic layer 22.

The period (p) of the grating 28 is defined by:

$$p = \frac{\lambda}{2\sin(\theta)}$$

Where: λ=laser wavelength (nm); and
θ=angle between the two incident light beams.

For the OLED 20 above, p=300 nm, and the refractive index is 1.9.

FIG. 4a shows a graphical representation of the calculated emission properties (output average electric field ($E^2$) versus wavelength (nm)) of the conventional OLED 1 as represented by trace 31, in comparison to the grating assisted OLED 20 as represented by trace 32. From FIG. 4a it is evident from a comparison of the traces 31 and 32 that light enhancement of an OLED 20 comprising the grating 28 is increased in comparison to the conventional OLED 1 at all wavelengths between 400 nm and 500 nm.

FIG. 4b shows a graphical representation of the calculated emission properties (calculated output average electric filed ($E^2$) versus emission angle (degrees)) of the conventional OLED 1 as represented by trace 33, in comparison to the grating-assisted OLED 20 as represented by trace 34. It is evident from a comparison of traces 33 and 34 in FIG. 4b that both larger radiation and broader angle responses are obtained for the OLED 20 comprising the grating 28 for the majority of angles.

FIG. 4c shows a graphical representation of the electric field distributions for the grating-assisted OLED 20 at a wavelength of 410 nm, whereby the organic layer regions are indicated by the dashed lines 29.

Figures 5A, 5B, 6A, 6B:
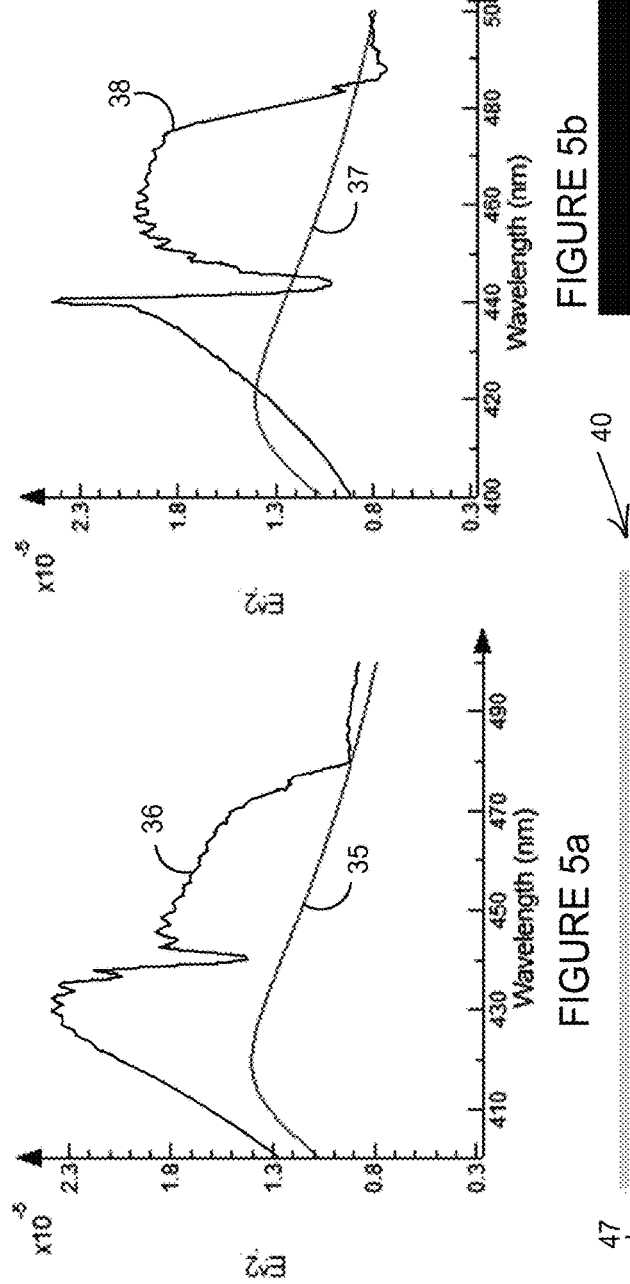

FIG. 5a shows a graphical representation of the calculated emission properties (output average electric field ($E^2$) versus wavelength (nm)) of the OLED 1, as represented by the trace 35 in comparison to the grating-assisted OLED 20 having a refractive index of 2.0 as represented by the trace 36; whilst FIG. 5b shows a graphical representation of the calculated emission properties (output average electric field ($E^2$) versus wavelength (nm)) of the OLED 1 as represented by the trace 37 in comparison to the grating-assisted OLED 20 having a refractive index of 2.1 as represented by the trace 38.

Furthermore, the refractive index of the grating 28 is tuneable by using different intensities of laser light for the interferometer. Varying the refractive index effects a variation in the peak wavelength of a grating assisted OLED 20. Such an effect is demonstrated in FIGS. 5a and 5b, whereby the refractive index of the gratings are 2.0 and 2.1 respectively. It will be seen from FIG. 5a that the peak wavelength of the grating-assisted OLED 20 having a refractive index of 2.0 is ~430 nm, as represented by trace 36.

Furthermore, it will be seen from FIG. 5b that the peak wavelength of the grating-assisted OLED 20 is 430 nm having a refractive index of 2.1 is ~440 nm, as represented by trace 38. The OLEDs 20 represented by FIGS. 5a and 5b comprise identical structural parameters, whereby the depths of the cathode layer, organic layer and anode layer are 100 nm, 110 nm and 120 nm respectively, whilst the grating period P is 300 nm.

Varying the depth of the grating 28 from 100 nm to 120 nm also results in a change in the output intensity.

FIG. 6a shows in section, a Fresnel lens structure grating-assisted OLED 40 according to a second embodiment of the present invention, whilst FIG. 6b is a representation of a Finite-difference time-domain (FDTD)-simulated Fresnel lens structure in the OLED 40, whereby an organic electroluminescent material layer 42 having a depth of 110 nm is located between two electrodes; an ITO anode 44 of 120 nm depth, and a reflecting cathode 46 of 100 nm depth, whilst a layer of protective glass 47 is provided atop the anode 44. As detailed above HIL, HTL, ETL and HBL could also be used in the OLED 40 to improve electrical efficiency as required.

As above, the organic layer 42 is formed of a formed of a photo-crosslinkable liquid crystal with rod-shaped dichroic molecules. An optical grating 48 is subsequently defined in the organic layer 42, whereby the grating 48 provides the organic layer 42 with a periodic refractive index change. The grating 28 is formed in the organic layer 22 using a Mach-Zehnder interferometer as described in relation to FIG. 3, but unlike the rectangle grating 28 of the first embodiment, the grating 48 is formed as a Fresnel lens structure.

Using such Fresnel-lens structure in the OLED 40, means that when light propagates in the organic layer 42, the light will be focussed at the far field.

Figure 7:
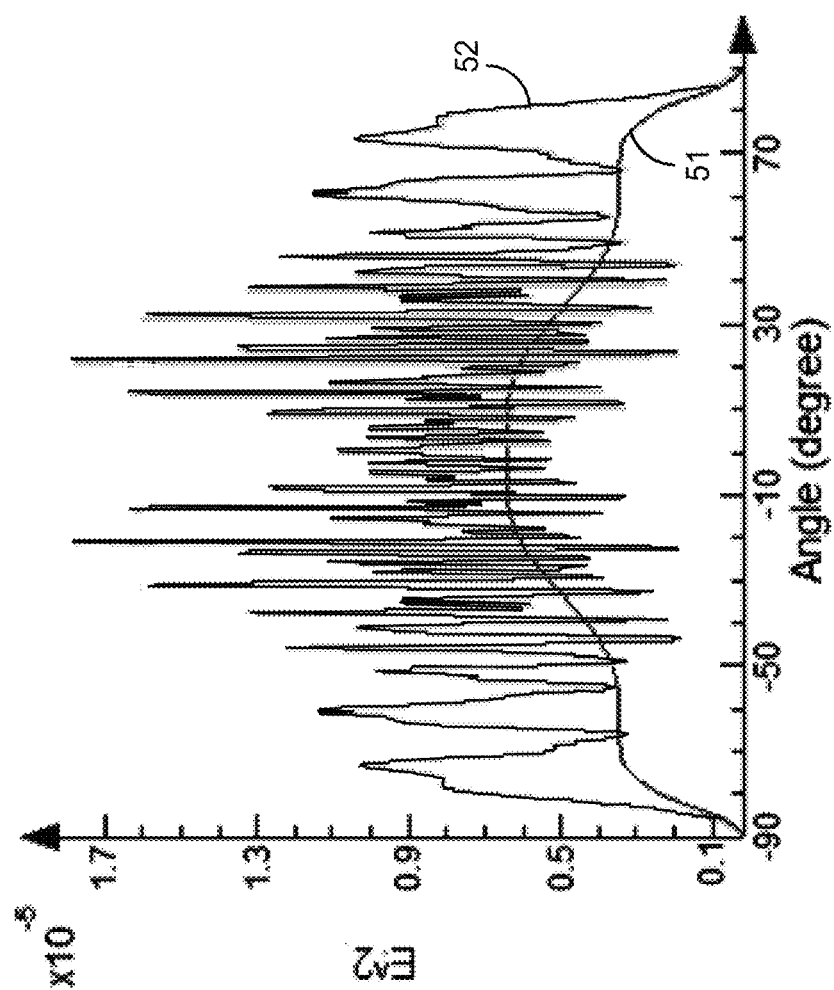

As demonstrated at FIG. 7, which shows a graphical representation of the calculated emission properties (calculated output average electric field ($E^2$) versus emission angle (degrees)) of the OLED 1 as represented by trace 51, in comparison to the Fresnel lens grating-assisted OLED 40 as represented by trace 52, the grating 48 provides increased light extraction at broader angles in comparison to the conventional OLED 1.

Although, rectangle and Fresnel-lens shaped profiles are disclosed in OLEDs 20 and 40 above respectively, it is also possible to use other grating profiles such as chirped, apodised, or any that will become apparent to the skilled person after reading this specification.

As demonstrated above, using an intensity-dependent-interference fringe technique to create a nanostructure grating in an organic layer of an OLED, provides a method of varying the refractive index of the organic layer, thereby inter alia increasing the out-coupling efficiency of the OLED in a low cost manner in comparison to techniques currently used to provide nanostructured gratings in materials. Furthermore, by varying the intensity of the light used to fabricate the gratings, it is possible to tune the refractive index of the organic layer.

The invention claimed is:

1. A method of fabricating an organic light emitting diode (OLED) device, the method comprising the steps of:
    providing an organic electroluminescent layer formed of a photo-crosslinkable liquid having dichroic molecules therein;
    forming a first electrode at a first surface of the electroluminescent layer and a second electrode at a second surface of the electroluminescent layer such that the electroluminescent layer is arranged between the first and second electrode, wherein the first electrode is fabricated from a transparent material and the second electrode is fabricated from a reflective material;
    defining a grating pattern in the photo-crosslinkable liquid by illuminating regions of the organic electroluminescent layer with a light beam; and
    wherein the refractive index of the grating pattern is tuned by adjusting the dosage of light to which the photo-crosslinkable liquid is exposed, and the illuminated regions of the organic electroluminescent layer are configured to form a chirped or apodised grating profile.

2. The method of claim 1, wherein the illuminated regions of the organic electroluminescent layer are exposed to differing dosages of light, thereby forming a variation of refractive index across the grating pattern.

3. The method of claim 1, wherein the OLED device has a peak wavelength that is selected by tuning the refractive index of the grating pattern.

4. The method of claim 1, further comprising forming at least one of: a hole injection layer, a hole transport layer, an electron transport layer or a hole blocking layer.

5. The method of claim 1, wherein illuminating regions of the organic electroluminescent layer with a light beam comprises illuminating the organic electroluminescent layer with first and second light beams having an angle therebetween, wherein the first and second light beams are configured to create an interference fringe in the organic electroluminescent layer.

6. The method of claim 1, wherein the photo-crosslinkable liquid is sensitive to UV-laser radiation.

7. The method of claim 1, wherein the dosage is dependent on the intensity of the light during the period of exposure of the organic electroluminescent layer to the light beam.

8. An organic light emitting diode (OLED) comprising a grating pattern in a photo-sensitive organic electroluminescent layer fabricated using the method of claim 1.

9. An electronic device incorporating an organic light emitting diode (OLED) as claimed in claim 8.

10. An organic light emitting diode (OLED), comprising:
a first and a second electrode;
an organic electroluminescent layer, formed between the first and second electrode;
wherein the organic electroluminescent layer is formed of a photo-crosslinkable liquid having dichroic molecules therein, the organic electroluminescent layer having a grating pattern defined therein by exposure of regions of the organic electroluminescent layer to a light beam, and the grating pattern has a chirped or apodised profile; and
wherein the refractive index of the exposed regions of the organic electroluminescent layer varies across the grating pattern, the first electrode is fabricated from a transparent material, and the second electrode is fabricated from a reflective material.

11. The organic light emitting diode of claim 10, wherein the photo-crosslinkable liquid is sensitive to UV-laser radiation.

12. The organic light emitting diode of claim 10, wherein the refractive index of the exposed regions of the organic electroluminescent layer is dependent on the dosage of light to which the organic electroluminescent layer is exposed.

13. The organic light emitting diode of claim 10, wherein the depth of the grating is between 100 nm and 120 nm.

14. The organic light emitting diode of claim 10, wherein the OLED further comprises at least one of: a hole injection layer, a hole transport layer, an electron transport layer or a hole blocking layer.

15. An organic light emitting diode (OLED) comprising:
a first and a second electrode, the first electrode formed from a transparent material and the second electrode formed from a reflective material;
an organic electroluminescent layer, formed between the first and second electrode;
wherein the organic electroluminescent layer is formed of a photo-crosslinkable liquid having dichroic molecules therein, the organic electroluminescent layer having a nano-structured grating pattern defined therein by exposure of regions of the organic electroluminescent layer to a light beam, the grating pattern having a chirped or apodised grating profile; and
wherein the grating pattern modifies the refractive index of the organic electroluminescent layer so as to be closer to the refractive index of the first electrode, thereby reducing the total internal reflection of light generated in the organic electroluminescent layer at the interface between the organic electroluminescent layer and the first electrode.

* * * * *